United States Patent
Hung et al.

(10) Patent No.: US 6,768,184 B2
(45) Date of Patent: Jul. 27, 2004

(54) FUSE STRUCTURE USED IN AN INTEGRATED CIRCUIT DEVICE

(75) Inventors: Jui-Lin Hung, Taipei (TW); Mang-Shiang Wang, Taichung (TW)

(73) Assignee: Nanya Technology Corporation, Taoyuan (TW)

( * ) Notice: Subject to any disclaimer, the term of this patent is extended or adjusted under 35 U.S.C. 154(b) by 7 days.

(21) Appl. No.: 10/071,061

(22) Filed: Feb. 7, 2002

(65) Prior Publication Data
US 2003/0094670 A1 May 22, 2003

(30) Foreign Application Priority Data
Nov. 19, 2001 (TW) .......................................... 90128590 A

(51) Int. Cl.$^7$ .............................................. H01L 29/00
(52) U.S. Cl. .................... 257/529; 257/209; 337/290; 337/293; 337/295; 438/281
(58) Field of Search ................................ 257/209, 529; 337/290, 292, 293, 295, 297; 438/132, 281, 607

(56) References Cited

U.S. PATENT DOCUMENTS

| | | | | |
|---|---|---|---|---|
| 5,321,300 A | * | 6/1994 | Usuda et al. ............... | 257/529 |
| 5,585,662 A | * | 12/1996 | Ogawa ........................ | 257/529 |
| 5,618,750 A | * | 4/1997 | Fukuhara et al. ........... | 438/601 |
| 6,008,716 A | * | 12/1999 | Kokubun ..................... | 337/297 |
| 6,218,721 B1 | * | 4/2001 | Niwa .......................... | 257/529 |
| 6,295,721 B1 | * | 10/2001 | Tsai ............................ | 29/623 |
| 6,335,229 B1 | * | 1/2002 | Pricer et al. ................. | 438/132 |
| 6,444,544 B1 | * | 9/2002 | Hu et al. ..................... | 438/467 |
| 6,562,674 B1 | * | 5/2003 | Tsuura ........................ | 438/215 |
| 2002/0079552 A1 | * | 6/2002 | Koike ......................... | 257/529 |

FOREIGN PATENT DOCUMENTS

JP  4-3-83361  *  4/1991  ................. 257/529

* cited by examiner

Primary Examiner—George C. Eckert
(74) Attorney, Agent, or Firm—Ladas & Parry

(57) ABSTRACT

A novel fuse structure. An optimal position of laser spot is defined above a substrate. A first conductive layer is formed on part of the substrate. A dielectric layer is formed on the substrate and the first conductive layer. A second conductive layer comprising the position of laser spot is formed on part of the dielectric layer. A third conductive layer is formed on the part of the dielectric layer placed above the first conductive layer, wherein the third conductive layer is insulated from the first and second conductive layers. At least one conductive plug penetrates the dielectric layer, to electrically connect the first conductive layer and the second conductive layer. Thus, the third conductive layer serves as a floating layer to prevent the first conductive layer from being damaged in the laser blow process.

13 Claims, 3 Drawing Sheets

US 6,768,184 B2

FUSE STRUCTURE USED IN AN INTEGRATED CIRCUIT DEVICE

BACKGROUND OF THE INVENTION

1. Field of the Invention

The present invention relates to a fuse structure used in an integrated circuit device, and more particularly, to a novel fuse structure that can prevent the adjoining fuse structure from being damaged in the laser blow process.

2. Description of the Related Art

Fuses are routinely used in the design of monolithic integrated circuits (IC), and in particular in memory devices as elements for altering the configuration of the circuitry contained therein. As such, memories are commonly built which programmed capabilities wherein fuses are selectively "blown" by, e.g., a laser beam.

It is well known that random access memories (RAM) are designed with redundancies which include spare columns, rows, or even fully functional arrays, wherein when any of these spare elements fails, the defective row, column and the like are replaced by a corresponding element. Disabling and enabling of spare elements is accomplished by fuses which are blown (i.e., melted away) when required, preferably, by the laser beam.

Additionally, the technique of laser fuse deleting (trimming) has been widely used both in the memory and logic IC fabrication industries, as an effective way to improve functional yields and to reduce development cycle time. Yet, fuse blow yield and fuse reliability have been problematic in most conventional fuse designs.

FIG. 1 is a cross-section of a traditional fuse structure. FIG. 2 is a top view of a traditional fuse structure. And FIG. 1 shows the cross section C–C' of FIG. 2.

Referring to FIG. 1, symbol 100 shows an insulated layer substrate. A metal layer M0 is formed on part of the substrate 100. An oxide layer 120 is formed on the metal layer M0 and part of the substrate 100. A metal layer M1 having an optimal position of laser spot 110 is formed on part of the oxide layer 120. At least one conductive plug 130 is defined through the oxide layer 120, for electrically connecting the M0 layer and the M1 layer. A fuse window 140 is formed above part of the M1 layer comprising the position 110 and part of the oxide layer 120. Symbol 150 shows a passivation layer.

In FIG. 2, there are plural fuse structures 210, 220, 230 in the fuse window 140. Each fuse structure 210, 220, 230 comprises the M0 layer, the plug 130 and the M1 layer. The solid line area shows the M1 layer, the dash line area shows the M0 layer, and each structure 210, 220, 230 comprises its own optimal position of laser spot 110. To give an example, a laser beam 290 blows the position 110 of the fuse structure 220. Because of misalignment of the laser beam 290 or thermal scattering of the laser beam 290, this laser blow process can damage the M0 layer of the fuse structures 210, 230 which near the fuse structure 220 by thermal shock. This causes the fuse structures 210, 230 to crack, and seriously affect device reliability and yield.

SUMMARY OF THE INVENTION

An object of the present invention is to provide the first fuse structure. An optimal position of laser spot is defined above a substrate. A first conductive layer is formed on part of the substrate. A dielectric layer is formed on the substrate and the first conductive layer. A second conductive layer comprising the position of laser spot is formed on part of the dielectric layer. A third conductive layer is formed on the part of the dielectric layer placed above the first conductive layer, where the third conductive layer is insulated from the first and second conductive layers. At least one conductive plug penetrates the dielectric layer, to electrically connect the first conductive layer and the second conductive layer.

The second fuse structure of the present invention is also provided. An optimal position of laser spot is defined above a substrate. A first conductive layer is formed on part of the substrate. A dielectric layer is formed on the substrate and the first conductive layer. A second conductive layer comprising the position of laser spot is formed on the dielectric layer. At least one conductive plug penetrates the dielectric layer, to electrically connect the first conductive layer and the second conductive layer.

The present invention improves on the prior art in that the third conductive serving as a floating layer is placed above the first conductive layer; or the second conductive layer is expanded above the first conductive layer. Thus, the invention can prevent both misalignment of the laser beam and thermal scattering of the laser beam from damaging the first layer of the fuse structure in the laser blow process, raises reliability and yield, and ameliorates the disadvantages of the prior art.

BRIEF DESCRIPTION OF THE DRAWINGS

The present invention can be more fully understood by reading the subsequent detailed description in conjunction with the examples and references made of the accompanying drawings, wherein:

FIG. 1 shows the cross section C–C' of FIG. 2;

FIG. 3 shows the cross section D–D' of FIG. 4;

FIG. 5 shows the cross section E–E' of FIG. 6;

DETAILED DESCRIPTION OF THE PREFERRED EMBODIMENT

The First Embodiment

Figure 1:
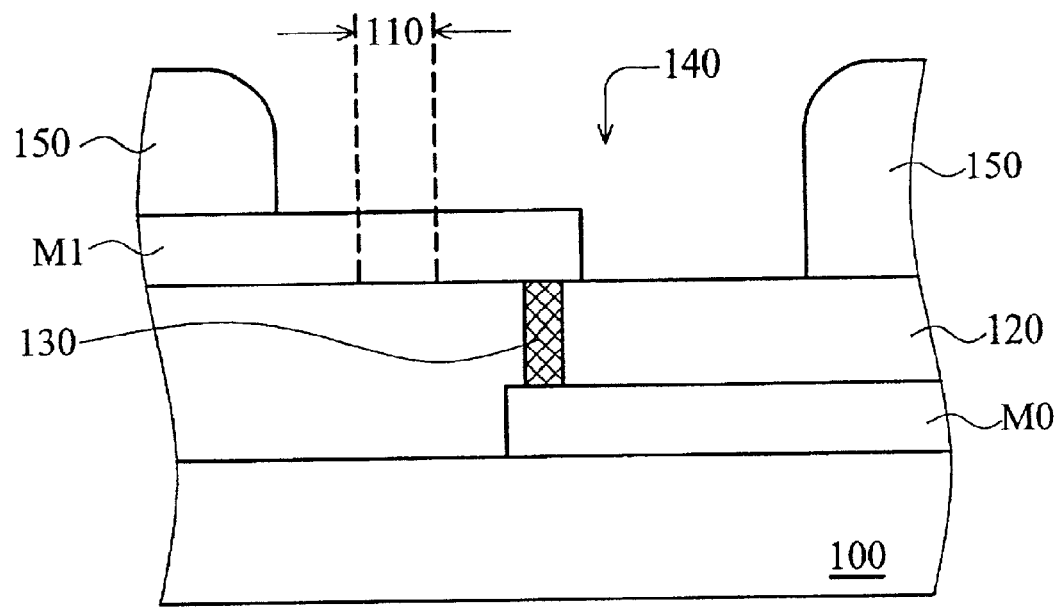
FIG. 1 is a sectional view of the fuse structure of the prior art.
Figure 2:
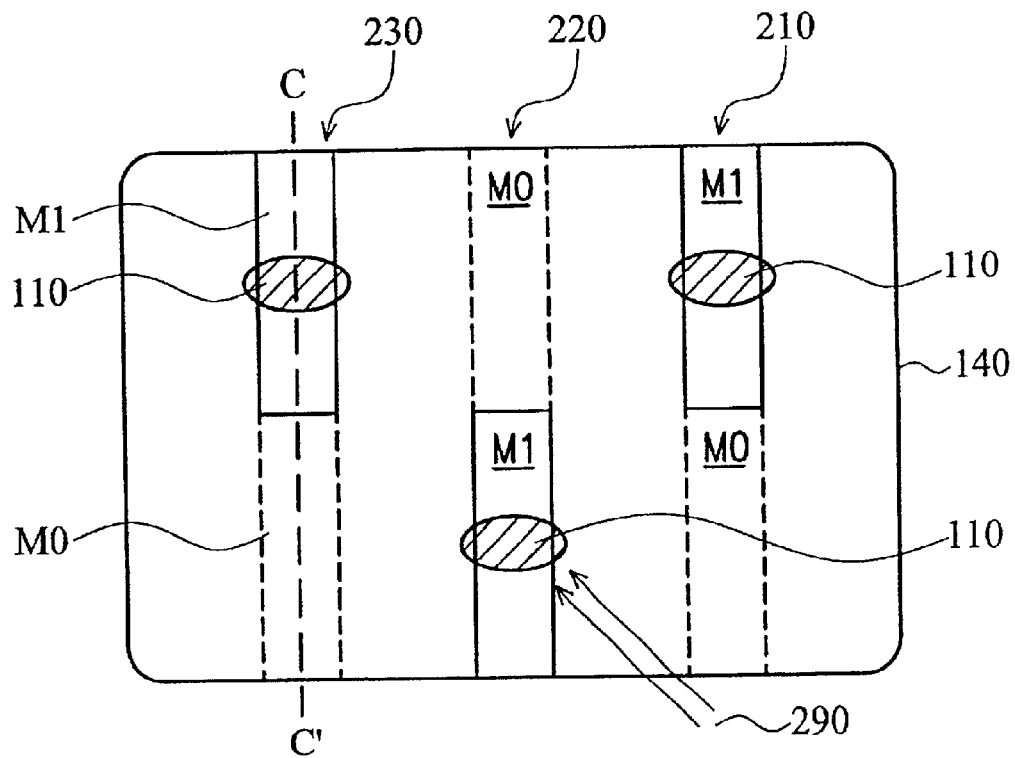
FIG. 2 is a top view of the fuse structure of the prior art.
Figure 3:
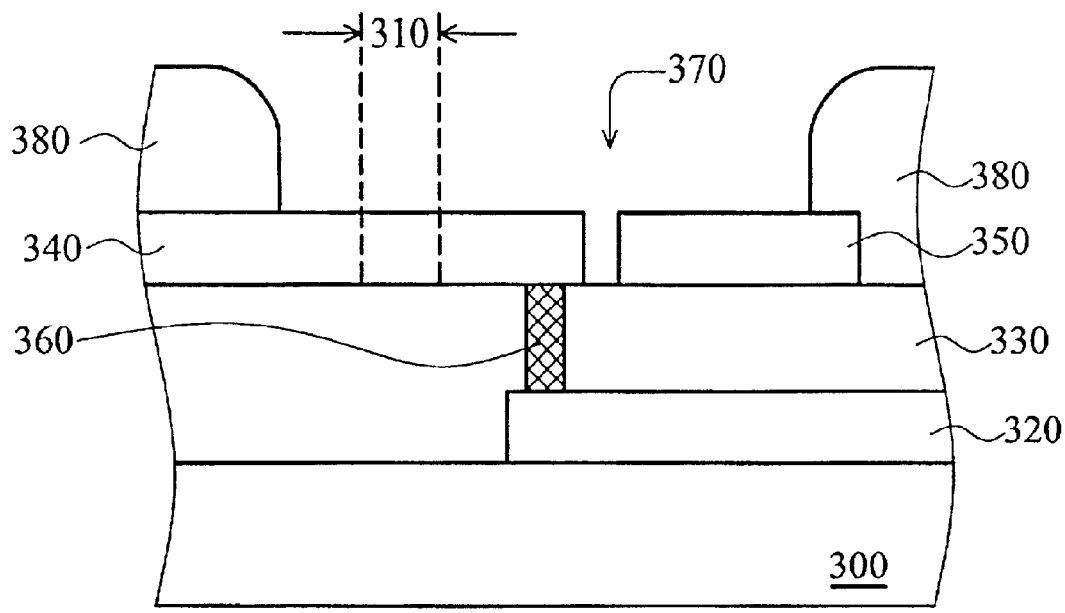
FIG. 3 is a sectional view of the fuse structure in the first embodiment of the present invention.
Figure 4:
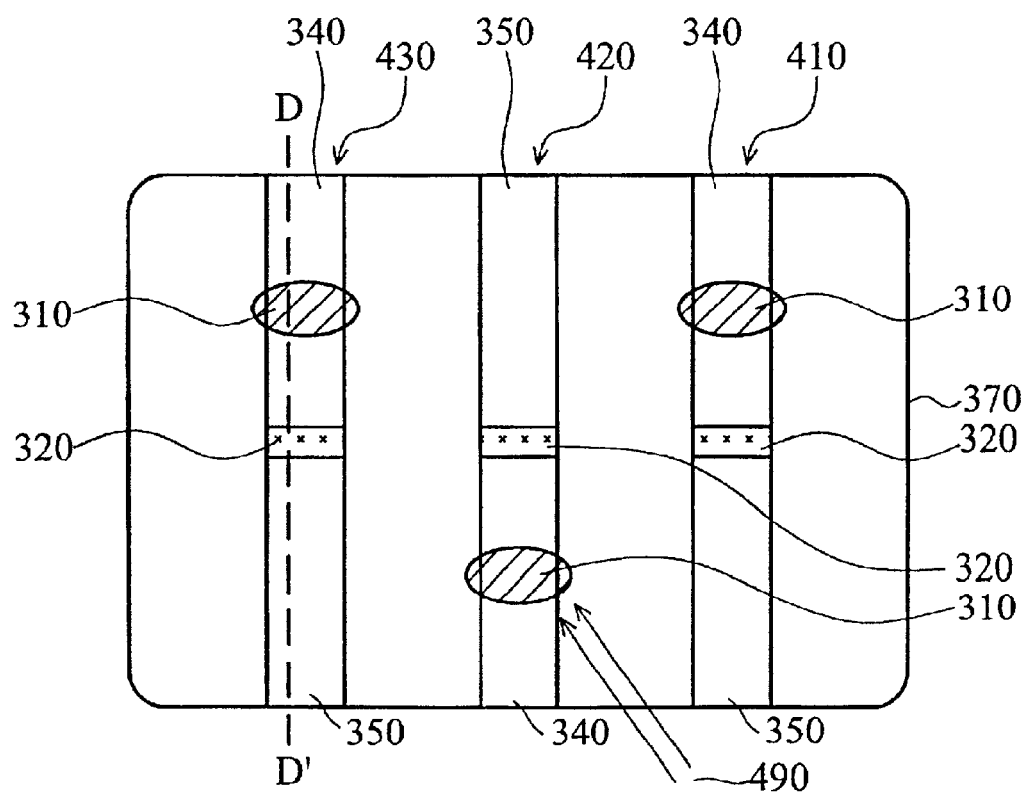
FIG. 4 is a top view of the fuse structure in the first embodiment of the present invention.

A fuse structure of the first embodiment is shown with reference to FIGS. 3–4. FIG. 3 is a sectional view of the fuse structure in the first embodiment of the present invention. FIG. 4 is a top view of the fuse structure in the first embodiment of the present invention, and FIG. 3 shows the cross section D–D' of FIG. 4.

Referring to FIG. 3, an optimal position of laser spot 310 is defined above an isolation substrate 300. A first conductive layer 320 is formed on the partial surface of the substrate 300. Then, a dielectric layer 330 is formed on the substrate 300 and the first conductive layer 320. The material of the substrate 300 may be $SiO_2$. The material of the first conductive layer 320 may be tungsten (W). The material of the dielectric layer 330 may be $SiO_2$.

In FIG. 3, a second conductive layer 340 comprising the position of laser spot 310 is formed on part of the dielectric layer 330. The material of the second conductive layer 340 may be Al, AlCu alloy or poly-silicon.

In FIG. 3, a third conductive layer 350 is formed on the part of the dielectric layer 330 placed above the first conductive layer 320, where the third conductive layer 350 does not electrically connect with the first conductive layer 320 and second conductive layer 340. The material of the third conductive layer 350 may be Al, AlCu alloy or poly-silicon, and the second conductive layer 340 and the third conductive layer 350 can be formed in-situ.

In FIG. 3, at least one conductive plug 360 penetrates the dielectric layer 330, to electrically connect the first conductive layer 320 and the second conductive layer 340. The material of the plug 360 may be tungsten (W).

Moreover, referring to FIG. 3, a passivation layer 380 having a fuse window 370 is formed on the second conductive layer 340 and the third conductive layer 350. The fuse window 370 exposes the second conductive layer 340 comprising the position of laser spot 310, part of the third conductive layer 350 and part of the dielectric layer 330. The material of the passivation layer 380 may be PE-TEOS $SiO_2$ or SiN.

FIG. 4 is a top view of the fuse structure in the first embodiment of the present invention, and FIG. 3 shows the cross section D–D' of FIG. 4. Generally, plural fuse structures 410, 420, 430 are formed in the fuse window 370, and do not electrically connect one another. Any of fuse structures 410, 420, 430 comprises the first conductive layer 320, the conductive plug 360, the second conductive layer 340 and the third conductive layer 350. Each of the fuse structures 410, 420, 430 has its own position of laser spot 310 on the second conductive layer 340. The laterals of the second conductive layer 340 having the position of laser spot 310 of any the fuse structures 410, 420, 430 correspond to the third conductive layer 350 of the adjoining fuse structure. The third conductive layer 350 serves as a floating layer to protect the first conductive layer 320 from being damaged in the laser blow process.

To give an example, refers to FIG. 4, a laser beam 490 blows the position 310 of the fuse structure 420. Because the third conductive layers 350, 350 of the fuse structures 410, 430 absorb the redundant laser energy, the laser beam 490 cannot damage the first conductive layer 320 of the fuse structures 410, 430 by thermal shock in the laser blow process when the misalignment of the laser beam 490 or thermal scattering of the laser beam 490 occurs. This prevents the fuse structure 410, 430 from cracking, and enhances device reliability and yield.

The Second Embodiment

Figure 5:
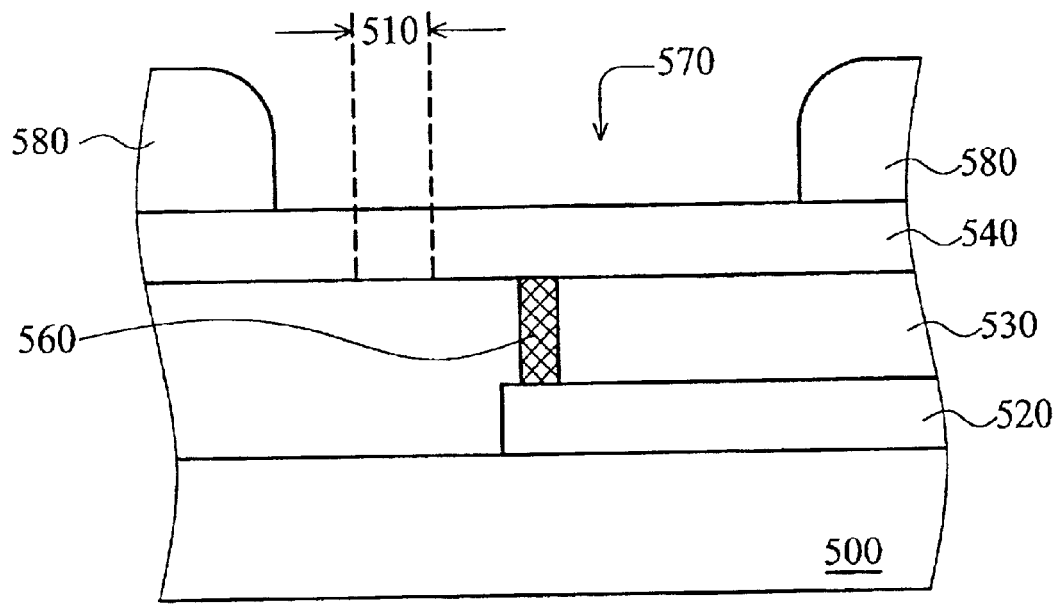
FIG. 5 is a sectional view of the fuse structure in the second embodiment of the present invention.
Figure 6:
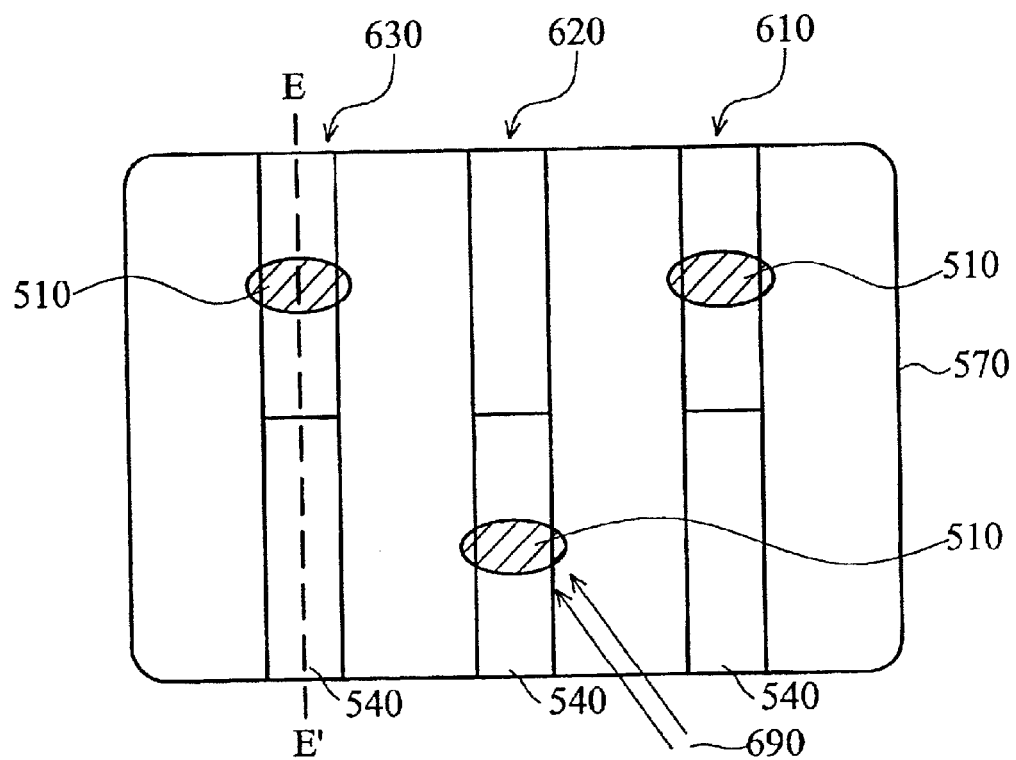
FIG. 6 is a top view of the fuse structure in the second embodiment of the present invention.

A fuse structure of the second embodiment is shown with reference to FIGS. 5~6. FIG. 5 is a sectional view of the fuse structure in the second embodiment of the present invention. FIG. 6 is a top view of the fuse structure in the first embodiment of the present invention, and FIG. 5 shows the cross section E–E' of FIG. 6.

Referring to FIG. 5, an optimal position of laser spot 510 is defined above an isolation substrate 500. A first conductive layer 520 is formed on the partial surface of the substrate 500. Then, a dielectric layer 530 is formed on the substrate 500 and the first conductive layer 520. The material of the substrate 500 may be $SiO_2$. The material of the first conductive layer 520 may be tungsten (W). The material of the dielectric layer 530 may be $SiO_2$.

In FIG. 5, a second conductive layer 540 comprising the position of laser spot 510 is formed on the dielectric layer 530. The material of the second conductive layer 540 may be Al, AlCu alloy or poly-silicon.

In FIG. 5, at least one conductive plug 560 penetrates the dielectric layer 530, to electrically connect the first conductive layer 520 and the second conductive layer 540. The material of the plug 560 may be tungsten (W).

Moreover, FIG. 5 shows a passivation layer 580 having a fuse window 570 formed on the second conductive layer 540. The fuse window 570 exposes the second conductive layer 540 comprising the position of laser spot 310. The material of the passivation layer 580 may be PE-TEOS $SiO_2$ or SiN.

FIG. 6 is a top view of the fuse structure in the second embodiment of the present invention and FIG. 5 shows the cross section E–E' of FIG. 6. Generally, a plurality of fuse structures 610, 620, 630 are formed in the fuse window 570, and do not electrically connect one another. Each of the fuse structures 610, 620, 630 comprises the first conductive layer 520, the conductive plug 560 and the second conductive layer 540. Each of the fuse structures 610, 620, 630 has its own position of laser spot 510 on the second conductive layer 540. The laterals of the portion of the second conductive layer 540 having the position of laser spot 510 of any the fuse structure 610, 620, 630 correspond to the portion of the second conductive layer 540 having no position of laser spot 510 of the adjoining fuse structure, so the second conductive layer 540 can protect the first conductive layer 520 from being damaged in the laser blow process.

To give an example, referring to FIG. 6, a laser beam 690 blows the position 510 of the fuse structure 620. Because the second conductive layers 540, 540 having no position of laser spot 510 of the fuse structures 610, 630 absorb the redundant laser energy, the laser beam 690 cannot damage the first conductive layers 520, 520 of the fuse structures 610, 630 by thermal shock in the laser blow process when misalignment of the laser beam 690 or thermal scattering of the laser beam 690 occurs. This prevents the fuse structures 610, 630 from cracking, and enhances device reliability and yield.

Finally, while the invention has been described by way of example and in terms of the above preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A fuse structure, comprising:

a substrate;

a first conductive layer formed on part of the substrate;

a dielectric layer formed on the substrate and the first conductive layer;

a second conductive layer comprising a position of laser spot formed on part of the dielectric layer;

a third conductive layer formed on the part of the dielectric layer placed above the first conductive layer and corresponding to the first conductive layer, wherein the third conductive layer is insulated from the first and second conductive layers, and the second conductive layer and the third conductive layer are arranged in a straight line;

a passivation layer having a window formed on the second conductive layer and the third conductive layer; and at least one conductive plug penetrating the dielectric layer, to electrically connect the first conductive layer and the second conductive layer, wherein the window exposes the second conductive layer comprising the position of laser spot, part of the third conductive layer and part of the dielectric layer.

2. The fuse structure according to claim 1, wherein the material of the first conductive layer is tungsten.

3. The fuse structure according to claim 1, wherein the material of the second conductive layer is Al, AlCu alloy or poly-silicon.

4. The fuse structure according to claim 1, wherein the material of the third conductive layer is Al, AlCu alloy or poly-silicon.

5. The fuse structure according to claim 1, wherein the material of the dielectric layer is SiO2.

6. The fuse structure according to claim 1, wherein the material of the conductive plug is tungsten.

7. The fuse structure according to claim 1, wherein the material of the passivation layer is PE-TEOS SiO2 or SiN.

8. A fuse window having a plurality of fuse structures, each of the fuse structures comprising:

a substrate;

a first conductive layer formed on part of the substrate;

a dielectric layer formed on the substrate and the first conductive layer;

a second conductive layer comprising a position of laser spot formed on part of the dielectric layer;

a third conductive layer formed on the part of the dielectric layer placed above the first conductive layer and corresponding to the first conductive layer, wherein the third conductive layer is insulated from the first and second conductive layers, and the second conductive layer and the third conductive layer are arranged in a straight line; and at least one conductive plug penetrating the dielectric layer, for electrically connecting the first conductive layer and the second conductive layer;

wherein each of the fuse structures has one position of laser spot on the second conductive layer, and the fuse structures are insulated from one another, and both sides of the second conductive layer having the position of laser spot of any of the fuse structures correspond to the third conductive layer of the adjoining fuse structure.

9. The fuse window according to claim 8, wherein the material of the first conductive layer is tungsten.

10. The fuse window according to claim 8, wherein the material of the second conductive layer is Al, AlCu alloy or poly-silicon.

11. The fuse window according to claim 8, wherein the material of the third conductive layer is Al, AlCu alloy or poly-silicon.

12. The fuse window according to claim 8, wherein the material of the dielectric layer is SiO2.

13. The fuse window according to claim 8, wherein the material of the conductive plug is tungsten.

* * * * *